United States Patent
Ono et al.

(10) Patent No.: US 6,864,159 B2
(45) Date of Patent: Mar. 8, 2005

(54) METHOD FOR FABRICATING III-V COMPOUND SEMICONDUCTOR

(75) Inventors: Yoshinobu Ono, Ibaraki (JP); Masahiko Hata, Tsuchiura (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/046,741

(22) Filed: Jan. 17, 2002

(65) Prior Publication Data

US 2002/0132453 A1 Sep. 19, 2002

(30) Foreign Application Priority Data

Jan. 17, 2001 (JP) ........................................ 2001-009144

(51) Int. Cl.[7] .............................................. H01L 21/00
(52) U.S. Cl. ........................ 438/479; 438/48; 438/483
(58) Field of Search .................... 438/22–47, 479–509, 438/478

(56) References Cited

U.S. PATENT DOCUMENTS

| | | | | |
|---|---|---|---|---|
| 4,426,701 A | * | 1/1984 | Botez | |
| 5,216,684 A | * | 6/1993 | Wang et al. | 372/45 |
| 5,477,325 A | * | 12/1995 | Miyashita et al. | |
| 5,528,615 A | * | 6/1996 | Shima | |
| 5,639,674 A | * | 6/1997 | Nozaki et al. | |
| 5,956,361 A | * | 9/1999 | Ikeda et al. | |
| 6,117,699 A | * | 9/2000 | Lemoff et al. | |

FOREIGN PATENT DOCUMENTS

JP          8-241896          9/1996

OTHER PUBLICATIONS

Narui, "Metalorganic Vapor Deposition of AlGaAs on Ridged GaAs(100) Substrate For Low Threshold Current Laser" Journal of Crystal Growth 167(1996) 452–457.*

* cited by examiner

Primary Examiner—Savitri Mulpuri
(74) Attorney, Agent, or Firm—Birch, Stewart, Kolasch, & Birch, LLP

(57) ABSTRACT

A method for fabricating a III–V Group compound semiconductor comprising a step of epitaxially growing on an $Al_xGa_{1-x}As$ layer of lower Al content an $Al_xGa_{1-x}As$ layer of higher Al content, in which step a growth rate of the $Al_xGa_{1-x}As$ layer of higher Al content is made slower than a growth rate of the $Al_xGa_{1-x}As$ layer of lower Al content, thereby effectively inhibiting the occurrence of starting points of abnormal growth at the interface between the two layers.

10 Claims, 3 Drawing Sheets

METHOD FOR FABRICATING III-V COMPOUND SEMICONDUCTOR

BACKGROUND OF THE INVENTION

1. Field of the Invention

This invention relates to method for fabricating a III–V Group compound semiconductor that inhibits occurrence of surface defects caused by abnormal growth.

2. Background Art

Gallium arsenide (GaAs) not only has a direct transition band structure but is also capable of forming heterostructures with good lattice-matching property in combination with compound semiconductor materials represented by the general formula $Al_xGa_{1-x}As$ ($0 \leq x < 1$). GaAs/AlGaAs hetero-structures are therefore frequently adopted in semiconductor lasers and numerous other types of optical semiconductor devices because they are easy to fabricate and excellent in quality.

An optical device such as an LED adopting such a structure, for example, is fabricated by epitaxially growing thin-film layers of $Al_xGa_{1-x}As$ ($0 \leq x < 1$) on a GaAs substrate to produce a multilayer structure. The process of forming an $Al_xGa_{1-x}As$ multilayer structure involves overlaying a layer of higher Al content on a layer of lower Al content. Moreover, the layer of higher Al content has a relatively large thickness of around 100 nm.

When an $Al_xGa_{1-x}As$ layer of higher Al content is epitaxially grown on an $Al_xGa_{1-x}As$ layer of lower Al content in this manner, the $Al_xGa_{1-x}As$ multilayer structure is prone to internal football-shaped abnormal growth. As such abnormal growth produces a defect that acts as a path of leak current, it adversely affects the electrical properties and/or optical properties of the device. In addition, the effect of such football-shaped abnormal growth extends to the crystal growth surface and degrades its flatness. The resulting surface irregularity spoils the adherence of the various patterning masks to degrade patterning accuracy and degrade the quality of the device.

SUMMARY OF THE INVENTION

One object of the present invention is therefore to provide a method for fabricating a III–V Group compound semiconductor that overcomes the foregoing problems of the prior art.

In accordance with one aspect, the present invention achieves the foregoing objects by providing a method for fabricating a III–V Group compound semiconductor comprising a step of epitaxially growing on an $Al_xGa_{1-x}As$ layer of lower Al content an $Al_xGa_{1-x}As$ layer of higher Al content, in which step a growth rate of the $Al_xGa_{1-x}As$ layer of higher Al content is made slower than a growth rate of the $Al_xGa_{1-x}As$ layer of lower Al content, thereby effectively inhibiting the occurrence of starting points of abnormal growth at the interface between the two layers. When a layer of higher Al content is grown on a layer of lower Al content with the growth rate of the layer of higher Al content made slower than the growth rate of the layer of lower Al content in this manner, occurrence of abnormal growth can be inhibited without altering the crystal quality and, as a result, the area ratio of abnormalities at the semiconductor surface obtained by the epitaxial growth can be held to a considerably lower level than heretofore.

Thus, the present invention provides a method for fabricating a III–V Group compound semiconductor comprising a step of forming on a GaAs substrate by epitaxial growth an $Al_xGa_{1-x}As$ multilayer structure ($0 \leq x < 1$) including a structure obtained by overlaying on a first layer of lower Al content a second layer of higher Al content, in which step the first layer is epitaxially grown first and the second layer is then epitaxially grown on the first layer at slower epitaxial growth rate than that used to epitaxially grow the first layer.

The present invention also provides a method for fabricating a III–V Group compound semiconductor comprising a step of successively epitaxially growing thin films to fabricate a III–V Group compound semiconductor composed of a buffer layer having a multilayer structure of thin-film layers of compositions represented by $Al_{xi}Ga_{1-xi}As$ ($0 \leq xi < 1$, $i=1, 2, \ldots n$) formed on a GaAs substrate and an upper multilayer structure of layers of compositions represented by $Al_{yj}Ga_{1-yj}As$ ($0 \leq yj < 1$, $j=1, 2, \ldots$) formed on the buffer layer, wherein the Al content of an uppermost thin-film layer among the buffer layers is lower than the Al content of an adjacent upper multilayer structure layer formed on the uppermost thin-film layer, in which step a growth rate of the adjacent layer is made slower than a growth rate of the uppermost layer. The upper limit of i is not especially limited, but it is preferably 30 or less. Also, the upper limit of j is not especially limited, but it is preferably 20 or less.

This invention will be better understood and other objects and advantages thereof will be more apparent from the following detailed description of preferred embodiments with reference to the accompanying drawings.

DESCRIPTION OF THE PREFERRED EMBODIMENTS

Figure 1:
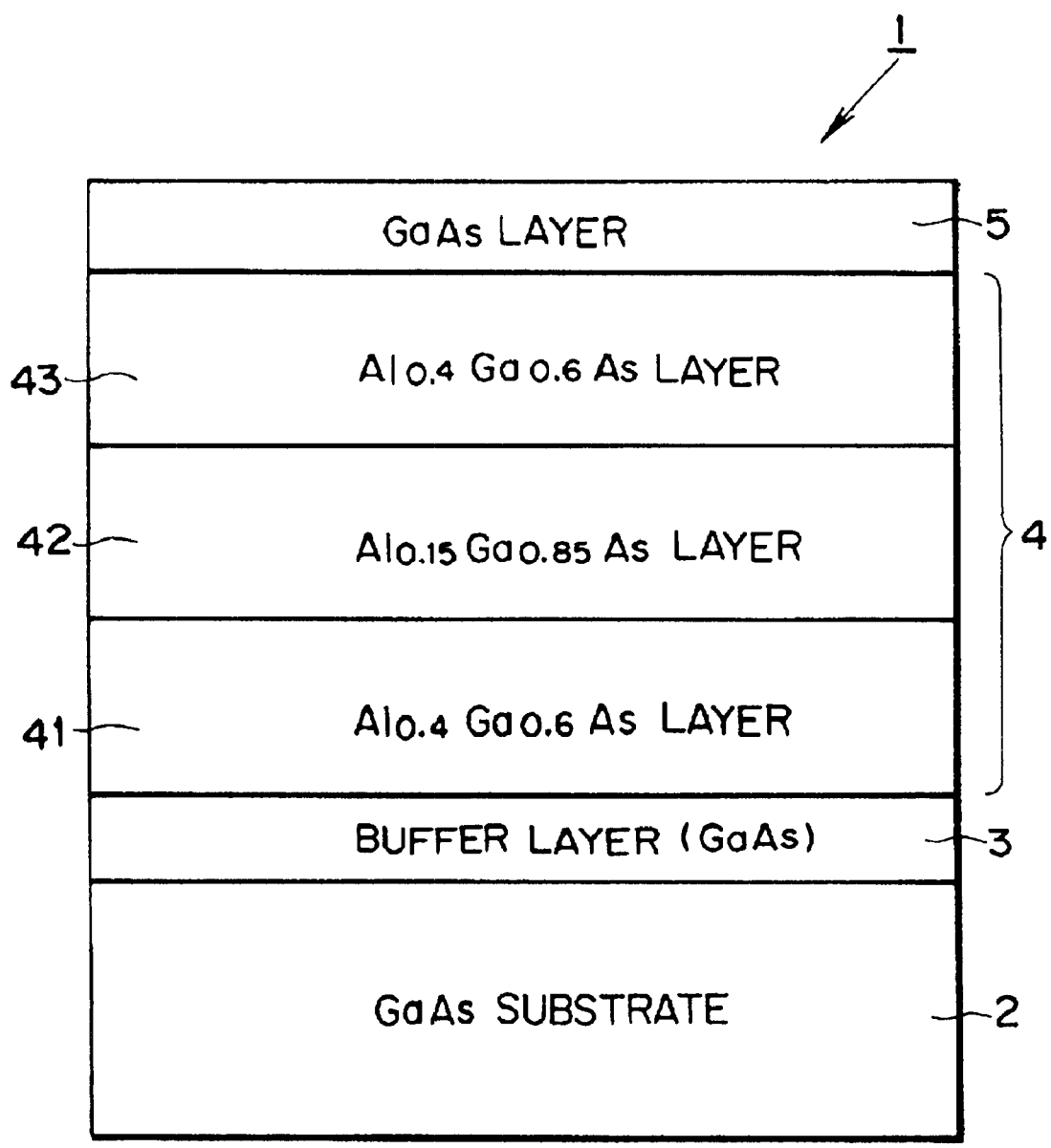
FIG. 1 is a sectional view schematically illustrating a thin-film crystal wafer for explaining an embodiment of the method of the present invention.

FIG. 1 is a sectional view schematically illustrating a thin-film crystal wafer for explaining an embodiment of the method of the present invention. The thin-film crystal wafer 1, which is used in the manufacture of an optoelectronic device, is a III–V Group compound semiconductor fabricated by using metal organic chemical vapor deposition (MOCVD) to epitaxially grow and overlay multiple semiconductor thin-film crystal growth layers on a GaAs substrate 2 composed of semi-insulating GaAs compound semiconductor crystal.

First, a buffer layer 3 constituted as a GaAs layer is formed on the GaAs substrate 2. The buffer layer 3 is a thin-film crystal growth layer formed to a thickness of 100 nm by epitaxially growing GaAs on the semi-insulating GaAs substrate by MOCVD.

On the Al component-free buffer layer 3 is formed a multilayer structure 4 that is a multilayer block of thin-film layers of compositions represented by the general formula $Al_xGa_{1-x}As$ ($0 \leq x < 1$). In this embodiment, the multilayer structure 4 is formed by conducting MOCVD to successively epitaxially grow on the buffer layer 3 an $Al_{0.4}Ga_{0.6}As$ layer 41, and $Al_{0.15}Ga_{0.85}As$ layer 42 and an $Al_{0.4}Ga_{0.6}As$ layer 43 on the buffer layer 3, each to a thickness several times greater than the 100 nm thickness of the buffer layer 3. Specifically, the $Al_{0.4}Ga_{0.6}As$ layer 41 is formed to a thickness of 500 nm, the $Al_{0.15}Ga_{0.85}As$ layer 42 to a thickness of 1000 nm and the $Al_{0.4}Ga_{0.6}As$ layer 43 to a thickness of 500 nm.

In this specification, the Al content of a layer is on occasion expressed in comparison with a layer that has no (0) Al component. For example, the Al content of the $Al_{0.4}Ga_{0.6}As$ layer 41, which is 0.4, is said to be greater than the Al content of the buffer layer 3, which is 0. Thus the $Al_{0.4}Ga_{0.6}As$ layer 41 of higher Al content is said to be epitaxially grown on the buffer layer 3 of lower Al content. Based on the results of various experiments, the inventors discovered that a starting point of abnormal growth occurring under such conditions generally occurs at the interface produced when an $Al_xGa_{1-x}As$ of higher Al content is grown on an $Al_xGa_{1-x}As$ of lower Al content. The likelihood of a starting point of abnormal growth occurring at the interface between the buffer layer 3 and the $Al_{0.4}Ga_{0.6}As$ layer 41 is therefore high.

Figure 3:
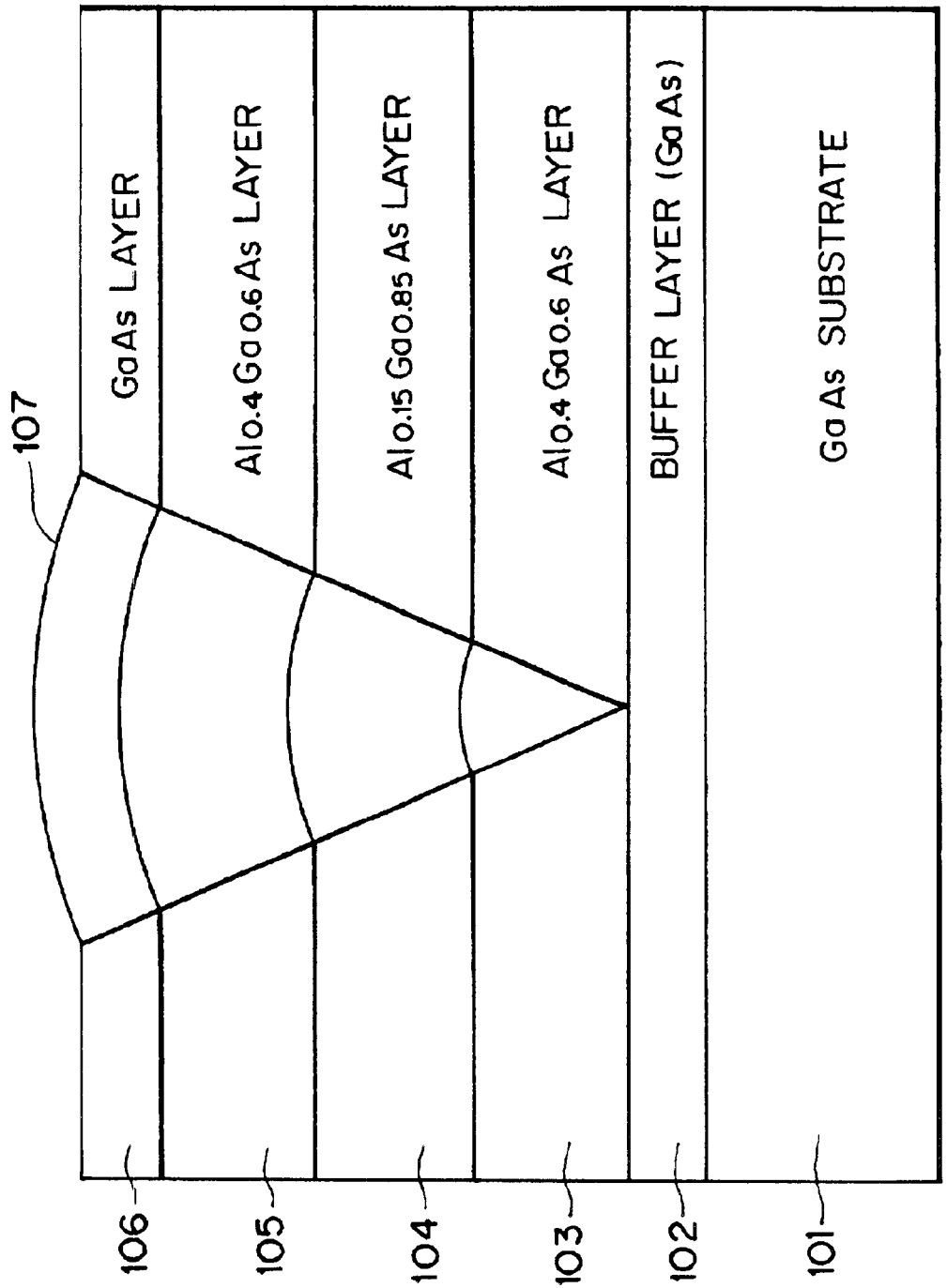
FIG. 3 is a sectional schematic view showing a case of abnormal growth occurrence in a thin-film crystal wafer.

This will be explained with reference to FIG. 3. FIG. 3 is a sectional schematic view showing the result that was obtained by successively epitaxially growing on a GaAs substrate 101 a GaAs buffer layer 102 to a thickness of 100 nm, an $Al_{0.4}Ga_{0.6}As$ layer 103 to a thickness of 500 nm, an $Al_{0.15}Ga_{0.85}As$ layer 104 to a thickness of 1000 nm, an $Al_{0.4}Ga_{0.6}As$ layer 105 to a thickness of 500 nm, and a GaAs layer 106 to a thickness of 50 nm. Reference numeral 107 in FIG. 3 designates an abnormal growth portion, which can be seen to have formed by expanding conically upward from the interface between the buffer layer 102 and the $Al_{0.4}Ga_{0.6}As$ layer 103 as a starting point. In other words, it can be seen that when the $Al_{0.4}Ga_{0.6}As$ layer 103 of higher Al content was epitaxially grown on the buffer layer 102 of lower Al content, a small abnormal growth portion occurring at a portion of the interface between the two layers became a starting point from which the abnormal growth portion 107 expanded upwardly with the growth of the successively overlaid thin-film crystal layers. The abnormal growth portion grew larger in each layer above the starting point in proportion to the layer thickness to finally degrade the condition of the upper surface.

Prompted by this finding, the inventors conducted a study based on a series of experiments. As a result, the inventors learned that abnormal growth occurring during epitaxial crystal growth is related to the amount of Al content and the growth rate and that abnormal growth can be effectively inhibited by lowering the growth rate in proportion as the Al content increases.

The reason for the occurrence of a starting point of abnormal growth at the interface between a layer of lower Al content and a layer of higher Al content grown thereon was found to be that growth in the step flow mode, i.e., normal growth, tends to be easily disrupted to give rise to a three-dimensional growth mode (abnormal growth mode).

During the progress of normal growth, terrace steps occur at substantially regular intervals and atoms supplied to the crystal surface are captured by the steps. Crystal growth progresses with advance of the steps. The terrace length, i.e., the distance between adjacent steps, is determined by factors such as the substrate offset angle, quantity of atoms supplied to the surface per unit time, and the magnitude of surface atom migration (surface migration length). As Al atoms are smaller than Ga atoms, the average migration length grows shorter with increasing Al content in the AlGaAs.

The probability of atoms supplied to the surface being captured by a terrace step (i.e., the probability that normal crystal growth will progress) depends heavily on the relationship between the magnitude of the interval between the steps formed on the surface (the terrace length) and the magnitude of the migration of the atoms supplied to the surface (the surface migration length). When the surface migration length is about the same as or larger than the terrace length, nearly all atoms supplied to the crystal surface can migrate to a terrace step, making it easy to achieve normal growth. On the other hand, when the surface migration length is shorter than the terrace length, the percentage of all surface atoms supplied to the crystal surface that can reach a terrace step decreases markedly. As a result, many surface atoms are captured by defects etc. on top of the terraces, making the probability of abnormal growth high.

When a layer of consistent composition grows normally, it can be considered that the relationship of the surface migration length being about the same as or greater than the terrace length holds, but when a layer of higher Al content is grown on a layer of lower Al content, this relationship is difficult to establish at the interface and abnormal growth is apt to occur.

In order to prevent the abnormal growth, it is necessary to (1) shorten the terrace length of the layer of lower Al content formed at the interface and/or (2) lengthen the migration length of the layer of higher Al content. A specific measure for achieving (1) is to increase the growth rate of the layer of lower Al content. Specific measures for achieving (2) are to increase the growth temperature of the layer of higher Al content and to decrease the V Group material vs III Group material supply ratio (V/III ratio).

When a method that changes the growth temperature and the V/III ratio for each layer grown is adopted, the crystal quality of the layers tends to vary and the result may be unusable depending on the type of device to be fabricated. The only method capable of inhibiting of abnormal growth without modifying crystal quality is that of increasing the growth rate of the layer of lower Al content. That is, the growth rate of the layer of lower Al content should be made somewhat faster than the growth rate of the layer of higher Al content. Growth rate control can be readily achieved by means of, for instance, organo-metallic material supply control, gas flow rate control, or growth temperature control. The method of controlling the amount of organo-metallic material supplied is generally adopted because it is good in controllability and causes little change in crystal quality.

Explanation will now be continued with reference to FIG. 1. The epitaxial growth rate of the $Al_{0.4}Ga_{0.6}As$ layer 41 is selected to be slower than the growth rate of the buffer layer 3. The $Al_{0.4}Ga_{0.6}As$ layer 41 is, for example, preferably formed to a thickness of 500 nm at a growth rate that is about one-half the growth rate of the buffer layer 3.

The growth rate that needs to be set varies with the difference in the Al contents. When the Al content difference is relatively small, the growth rate ratio (growth rate of layer of higher Al content/growth rate of layer of lower Al content) can be near 1, but when it is large, the growth rate ratio must be lowered to around ½ or an even smaller value.

The movement of Al atoms during epitaxial growth is sluggish compared with the movement of the atoms of the other components. When the growth rate of the $Al_{0.4}Ga_{0.6}As$ layer 41 is selected in the foregoing manner, therefore, the Al atom migration time required for normal growth of the $Al_{0.4}Ga_{0.6}As$ layer 41 can be secured to effectively inhibit occurrence of starting points of abnormal growth at the interface between the buffer layer 3 and the $Al_{0.4}Ga_{0.6}As$ layer 41.

As a result, the surface defect rate at the upper surface of the completed multilayer structure 4 is markedly lower than heretofore.

Thus in a process of expitaxially growing multilayers of AlGaAs on a GaAs substrate that involves firstly growing a buffer layer to establish the required crystal quality and then growing devices layers for performing prescribed functions on the buffer layer, abnormal growth is apt to occur at the interface between buffer layer and the first device layer if the Al content of the first device layer is higher. As pointed out in the discussion above, however, such abnormal growth can be effectively inhibited by making the growth rate ratio between the device layer and buffer layer small.

Another helpful measure is to increase the Al content of the buffer layer stepwise to bring it near the Al content of the first device layer at the interface between the two. Since this reduces the Al content difference at the interface, it makes abnormal growth inhibition possible with a relatively small reduction of the growth rate ratio.

After the $Al_{0.4}Ga_{0.6}As$ layer 41 has been formed in the foregoing manner, the $Al_{0.15}Ga_{0.85}As$ layer 42, the $Al_{0.4}Ga_{0.6}As$ layer 43 and a GaAs layer 5 are successively epitaxially grown thereon to thicknesses of 1000 nm, 500 nm and 50 nm, respectively. Abnormal growth does not occur at the interface between the $Al_{0.4}Ga_{0.6}As$ layer 41 and the $Al_{0.15}Ga_{0.85}As$ layer 42 and the interface between the $Al_{0.4}Ga_{0.6}As$ layer 43 and the GaAs layer 5 because these interfaces are formed between a layer of lower Al content grown on a layer of higher Al content.

Abnormal growth is liable to occur at the interface between the $Al_{0.15}Ga_{0.85}As$ layer 42 and the $Al_{0.4}Ga_{0.6}As$ layer 43, however, because it is formed by growing a layer of higher Al content on a layer of lower Al content. Still, even if abnormal growth should occur at this interface, the size of the resulting defect will be small and the surface irregularity minor, because the layers above the interface are thin. Moreover, since the defect will not pass through all of the device layers but will be limited to the upper layer region of the device layers, it will not usually cause a problem in terms of device properties. While this means that no particular measure need be implemented for inhibiting abnormal growth at the interface between the $Al_{0.15}Ga_{0.85}As$ layer 42 and the $Al_{0.4}Ga_{0.6}As$ layer 43, the occurrence of abnormal growth can nevertheless be inhibited if desired by making the growth rate ratio at the interface smaller than 1. The thin-film crystal wafer 1 fabricated in this manner exhibits very low abnormal growth and, therefore, the probability of abnormality arising in the device electrical properties and/or optical properties is low. In addition, when a process utilizing a mask is performed, the adherence between the surface of the thin-film crystal wafer 1 and the mask is much better than heretofore. As high-precision patterning is therefore possible, a device of excellent quality can be fabricated.

Figure 2:
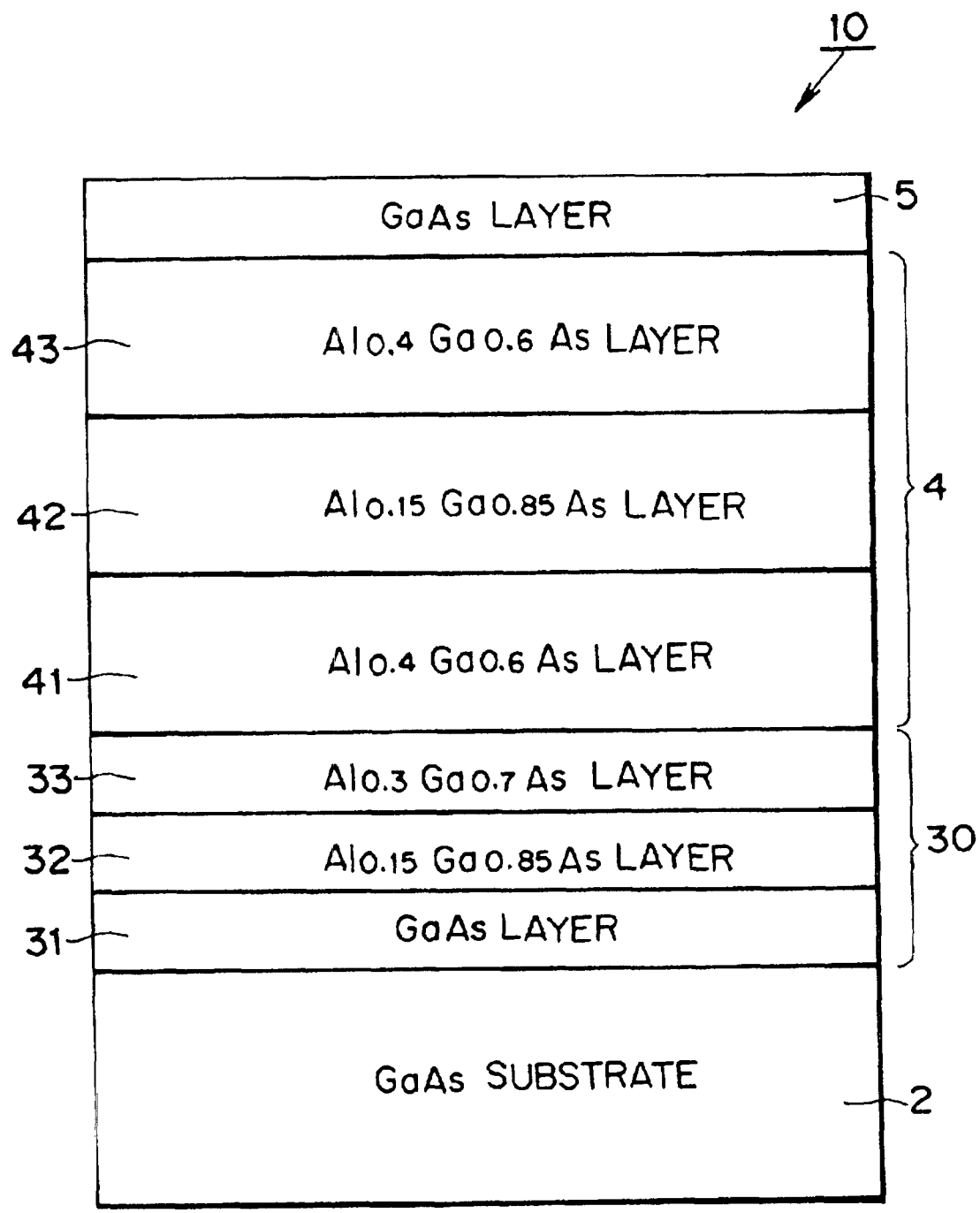
FIG. 2 is a sectional schematic view of a thin-film crystal wafer for explaining another embodiment of the method of the present invention.

FIG. 2 is a sectional view schematically illustrating a thin-film crystal wafer for explaining another embodiment of the method of the present invention. The thin-film crystal wafer 10 shown in FIG. 2 differs from the thin-film crystal wafer 1 shown in FIG. 1 only in the point that the buffer layer 3 of the thin-film crystal wafer 1 is replaced by a buffer layer 30 having a three-layer structure formed by successively epitaxially growing and overlaying a GaAs layer 31, an $Al0.15Ga_{0.85}As$ layer 32 and an $Al_{0.3}Ga_{0.7}As$ layer 33. The portions in FIG. 2 that correspond to portions in FIG. 1 are therefore assigned like reference symbols and will not be explained again here.

The formation of the buffer layer 30 will now be explained. First, the GaAs layer 31 is formed by epitaxially growing GaAs on the semi-insulating GaAs substrate 2. The $Al_{0.15}Ga_{0.85}As$ layer 32 is then formed. The $Al_{0.15}Ga_{0.85}As$ layer 32 is a thin-film crystal layer formed by epitaxially growing $Al_{0.15}Ga_{0.85}As$ on the GaAs layer 31. The buffer layer 30 is completed by next epitaxially growing growing $Al_{0.3}Ga_{0.7}As$ on the $Al_{0.15}Ga_{0.85}As$ layer 32 to form the $Al_{0.3}Ga_{0.7}As$ layer 33. In this embodiment, the GaAs layer 31 is formed to a thickness of 100 nm, the $Al_{0.15}Ga_{0.85}As$ layer 32 to a thickness of 50 nm, and the $Al_{0.3}Ga_{0.7}As$ layer 33 to a thickness of 50 nm.

As explained in the foregoing, the buffer layer 30 is a multilayer structure of thin films of compositions represented by the general formula $Al_{xi}Ga_{1-xi}As$ ($0 \leq xi < 1$, $i=1, 2, \ldots n$). In this embodiment, $i=3$. The multilayer structure 4 formed on the buffer layer 30 is an upper multilayer structure that is similarly formed of a multilayer structure of thin films of compositions represented by the general formula $Al_{yj}Ga_{1-yj}As$ ($0 \leq yj < 1$, $j=1, 2, \ldots$ ). The upper multilayer structure acts as an optical device layer.

Occurrence of abnormal growth during the process of forming the buffer layer 30 and the multilayer structure 4 is prevented similarly as in the embodiment explained with reference to FIG. 1, i.e., when a layer of higher Al content is epitaxially grown on a layer of lower Al content the growth rate of the layer of higher Al content is made slower than the growth rate of the layer of smaller Al content.

To be more specific, the GaAs layer 31, $Al_{0.15}Ga_{0.85}As$ layer 32 and $Al_{0.3}Ga_{0.7}As$ layer 33 constituting the buffer layer 30 are formed at relatively fast growth rates, and the $Al_{0.4}Ga_{0.6}As$ layer 41 that is the first layer of the muitilayer structure 4 is formed at a slower growth rate than the growth rate of the buffer layer 30.

As a result, the growth rate of the $Al_{0.4}Ga_{0.6}As$ layer 41 (the bottommost layer of the multilayer structure 4), whose Al content is higher than the Al content of the $Al_{0.3}Ga_{0.7}As$ layer 33 (the uppermost layer of the buffer layer 30), is slower than the growth rate of the $Al_{0.3}Ga_{0.7}As$ layer 33. Occurrence of starting points of abnormal growth at the interface between the $Al_{0.3}Ga_{0.7}As$ layer 33 and the $Al_{0.4}Ga_{0.6}As$ layer 41, i.e., the interface between the buffer layer 30 and the multilayer structure 4, is therefore effectively prevented to keep the area ratio of abnormalities at the surface of the GaAs layer 5 at a low level as in the case of the embodiment explained with reference to FIG. 1.

The thin-film crystal wafers 1 and 10 of FIGS. 1 and 2 were fabricated at different growth rates V1 of the buffer layers 3 and 30 and different growth rates V2 of the first layer $Al_{0.4}Ga_{0.6}As$ layer 41 of the multilayer structure 4, and the surface of each of the fabricated thin-film crystal wafers 1 and 10 was measured for area ratio of abnormalities R. The results are shown below.

| Results for structure shown in FIG. 1 | | |
| --- | --- | --- |
| V1 (nm/min) | V2 (nm/min) | R (%) |
| 80 | 40 | 0.25 |
| 80 | 60 | 0.31 |
| 80 | 80 | 0.54 |
| 60 | 80 | 1.1 |
| 40 | 80 | 2.5 |

| Results for structure shown in FIG. 2 | | |
| --- | --- | --- |
| V1 (nm/min) | V2 (nm/min) | R (%) |
| 80 | 40 | 0.22 |
| 80 | 60 | 0.27 |
| 80 | 80 | 0.42 |
| 60 | 80 | 1.2 |
| 40 | 80 | 2.2 |

It can be seen from the results of the measurements that in both the thin-film crystal wafer 1 and the thin-film crystal wafer 10 the abnormality area ratio R decreased relative to that at V1=V2 taken as a reference in proportion as V2 was slower than V1 and increased relative thereto in proportion as V2 was faster than V1.

In other words, the measurement results demonstrate that when an $Al_xGa_{1-x}As$ of higher Al content is epitaxially grown on an $Al_xGa_{1-x}As$ layer of a lower Al content, occurrence of abnormal growth can be effectively inhibited to greatly reduce the abnormality area ratio at the thin-film crystal wafer surface compared with that by existing technologies by making the growth rate of the $Al_xGa_{1-x}As$ layer of the higher Al content slower than the growth rate of the $Al_xGa_{1-x}As$ layer of lower Al content.

As set out in the foregoing, the method of the present invention achieves effective inhibition of abnormal growth, reduction of surface defect and enhancement of surface flatness of the semiconductor merely by controlling the epitaxial growth rate. It therefore enables manufacture of high-quality III–V compound semiconductors at low cost.

What is claimed is:

1. A method for fabricating a III–V compound semiconductor comprising a step of successively epitaxially growing thin films to fabricate a III–V Group compound semiconductor composed of a buffer layer having a multilayer structure of thin-filmed layers of compositions represented by $Al_{xi}Ga_{1-xi}As$ ($0 \leq xi < 1$, i=1, 2, ... n) formed on a flat GaAs substrate and an upper multilayer structure of layers of compositions represented by $Al_{yj}Ga_{1-yj}As$ ($0 \leq yj < 1$, j=1, 2, ... ) formed on the buffer layer, wherein the Al content of an uppermost thin-film layer among the buffer layers is lower than the Al content of an adjacent upper multilayer structure formed on the uppermost thin-film layer in which step a growth rate of the adjacent layer is made slower than a growth rate of the uppermost layer.

2. The method for fabricating a III–V Group compound semiconductor as claimed in claim 1, wherein the buffer layer is formed so that the Al contents of its thin-film layers increase stepwise from the GaAs substrate toward the upper multilayer structure.

3. A method for fabricating a III–V Group compound semiconductor comprising a step of growing on a flat GaAs substrate by epitaxial growth an $Al_{yj}Ga_{1-yj}As$ multilayer structure ($0 \leq yj < 1$, j=1,2, ... ) including a structure obtained by overlaying on a first layer of lower Al component content a second layer of higher Al component content, in which step the first layer is epitaxially grown first and the second layer is then epitaxially grown on the first layer at slower epitaxial growth rate than that used to epitaxially grow the first layer.

4. A method for fabricating a III–V Group compound semiconductor comprising:
   forming on a flat GaAs substrate by epitaxial growth an $Al_xGA_{1-x}As$ multilayer structure ($0 \leq x < 1$) including a structure obtained by overlaying on a first layer of lower Al content a second layer of higher Al content, and the second layer is epitaxially grown on the first layer at a slower epitaxial growth rate than that used to epitaxially grow the first layer.

5. The method for fabricating a III–V Group compounds semiconductor as claimed in claim 4, wherein the first layer is a buffer layer formed on the GaAs substrate.

6. The method for fabricating a III–V Group compound semiconductor as claimed in claim 4, wherein the first layer is a GaAs buffer layer formed on the GaAs substrate.

7. The method for fabricating a III–V Group compound semiconductor as claimed in claim 4, further comprising a step of forming on the second layer by epitaxial growth at least an $Al_{yj}Ga_{1-yj}As$ layer ($0 \leq yj < 1$, j=1, 2, ... ).

8. The method for fabricating a III–V Group compounds semiconductor as claimed in claim 4, wherein the $Al_xGa_{1-x}As$ multilayer structure includes a $Al_{0.15}Ga_{0.85}As$ layer and an $Al_{0.4}Ga_{0.6}As$ layer.

9. The method for fabricating a III–V Group compound semiconductor as claimed in claim 4, wherein a GaAs layer is formed over the $Al_xGa_{1-x}As$ multilayer structure.

10. The method for fabricating a III–V Group compound semiconductor as claimed in claim 4, wherein the $Al_xGa_{1-x}As$ multilayer structure includes a GaAs layer over which is an $Al_{0.4}Ga_{0.6}As$ layer, over which is an $Al_{0.15}Ga_{0.85}As$ layer, over which is an $Al_{0.4}Ga_{0.6}As$ layer, over which is formed a GaAs layer.

* * * * *